(12) United States Patent
Neumann et al.

(10) Patent No.: US 6,635,557 B2
(45) Date of Patent: Oct. 21, 2003

(54) HALOGEN DOPED SOLID STATE MATERIALS

(75) Inventors: David K. Neumann, Colorado Springs, CO (US); Thomas L. Henshaw, Monument, CO (US)

(73) Assignee: Neumann Information Systems, Inc, Colorado Springs, CO (US)

( * ) Notice: Subject to any disclaimer, the term of this patent is extended or adjusted under 35 U.S.C. 154(b) by 0 days.

(21) Appl. No.: 10/099,347

(22) Filed: Mar. 15, 2002

(65) Prior Publication Data

US 2003/0176048 A1 Sep. 18, 2003

(51) Int. Cl.[7] .......................... H01L 21/04; H01L 21/00
(52) U.S. Cl. .......................................... 438/510; 438/22
(58) Field of Search ..................... 438/510, 26–27, 438/34, 45, 532, 22

(56) References Cited

U.S. PATENT DOCUMENTS

| | | | |
|---|---|---|---|
| 4,261,854 A | 4/1981 | Kotera et al. ........ 252/301.4 H |
| 5,514,627 A * | 5/1996 | Lowery et al. ............... 438/26 |
| 5,593,782 A | 1/1997 | Budd ......................... 428/403 |
| 5,813,753 A * | 9/1998 | Vriens et al. ................ 362/293 |
| 5,910,661 A * | 6/1999 | Colvin, Jr. .................. 250/573 |
| 6,043,602 A | 3/2000 | Sun et al. .................... 313/503 |
| 6,124,072 A | 9/2000 | Arai et al. .................... 430/128 |
| 6,248,261 B1 | 6/2001 | Takemura et al. ..... 252/301.6 S |
| 6,252,254 B1 | 6/2001 | Soules et al. ................. 257/89 |
| 6,331,063 B1 | 12/2001 | Kamada et al. ............. 362/237 |
| 6,337,536 B1 | 1/2002 | Matsubara et al. ......... 313/498 |
| 6,344,717 B1 | 2/2002 | Lestician .................... 315/307 |

* cited by examiner

*Primary Examiner*—Craig Thompson
(74) *Attorney, Agent, or Firm*—Law Office of Dale B. Halling, LLC

(57) ABSTRACT

A tunable solid state laser has an optical quality solid material impregnated with a halogen dopant. An optical cavity resonator contains the solid material. An optical excitation source is coupled to the solid material. The doped material has additional applications as a coating to produce white light from blue light emitting diodes.

6 Claims, 3 Drawing Sheets

HALOGEN DOPED SOLID STATE MATERIALS

STATEMENT OF GOVERNMENT INTERESTS

This invention was made in the performance of a cooperative research and development agreement with the Department of the Air Force. The invention may be manufactured and used by and for the Government of the United States for all government purposes without the payment of any royalty.

FIELD OF THE INVENTION

The present invention relates generally to the field of lasers and wavelength conversion devices and more particularly to a tunable solid state laser and process of altering a wavelength of a light emitting diode.

BACKGROUND OF THE INVENTION

Tunable lasers are useful in a variety of applications, including optical pumps and spectrometry. Presently, dye lasers provide some tuning range. These lasers use a variety of dyes to provide a wide range of wavelengths. Unfortunately, the dye in these lasers tends to degrade quickly due to UV (ultraviolet) light from pump sources. In addition, dye lasers tend to have a narrow absorption band that limits their overall efficiency. Other tunable laser include Ti (Titanium) sapphire, ruby and alexandrite lasers. These lasers are all solid state laser and therefor do not suffer from the degradation problems of dye lasers. In addition, Ti sapphire has a broad tuning range. Unfortunately, Ti sapphire lasers are not scalable up to higher powers. In addition, there is always a need for a broader tuning range.

Thus there exists a need for a highly tunable laser in which the lasing material does not degrade or degrades very slowly and has a broader absorption band.

Another problem is white light LEDs (Light Emitting Diodes). Presently, white light LEDs are formed by combining a red, green and blue diodes. This is expensive since it requires three diodes. Another method of forming white light LEDs is by doping the substrate of a blue LED with an element. The doped substrate converts some of the blue light to a longer wavelength. The combination the longer wavelength light and blue light forms a "white" light. Unfortunately, the light from the prior art white light LEDs do not meet the highest quality color.

Thus there exists a need for a white light LED that is inexpensive and produces a broad, fairly flat, spectrum.

DETAILED DESCRIPTION OF THE DRAWINGS

A tunable solid state laser has a solid material impregnated with a halogen dopant. An optical cavity resonator contains the solid material. An optical excitation source is coupled to the solid material. In one embodiment, the dopant is molecular iodine, which facilitates the production of a broad and continuous emission when excited by visible or ultraviolet light. Placing the molecular iodine in a solid material results in broadening of the spectrum and filing in the voids. As a result the laser may be tuned over an extremely large range of wavelengths. The molecular iodine does not degrade with exposure to UV light like dye lasers.

This problem is closely related to the problem of obtaining white light LEDs (Light Emitting Diodes). A process of altering a wavelength of a light emitting diode, to obtain white light, includes the step of selecting a halogen dopant. Next a material is impregnated with the halogen dopant to form a doped material. The doped material is placed adjacent to a blue light emitting diode to form a white light LED. In one embodiment, the doped material is placed as a coating on a casing of the blue light LED (e.g, GaN LED). This process forms a broad white light spectrum. Note that the doped material is not a phosphor or electroluminescent phosphor.

Figure 1:
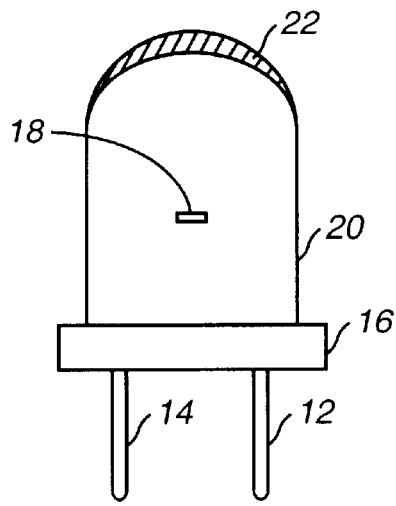
FIG. 1 is a cross section of a white light LED (Light Emitting Diode) in accordance with one embodiment of the invention.

FIG. 1 is a cross section of a white light LED 10 (Light Emitting Diode) in accordance with one embodiment of the invention. The LED 10 has an anode and cathode leads 12, 14 that extend though a base 16 and connected to a diode 18. The diode is enclosed by a casing 20 that is commonly a plastic. A halogen doped optical coating 22 covers a portion of the casing. When the diode is a blue diode (short wavelength), the coating 22 converts the blue light into a broad spectrum "white" light. In one embodiment the casing is formed by a halogen doped plastic (glass).

Figure 2:
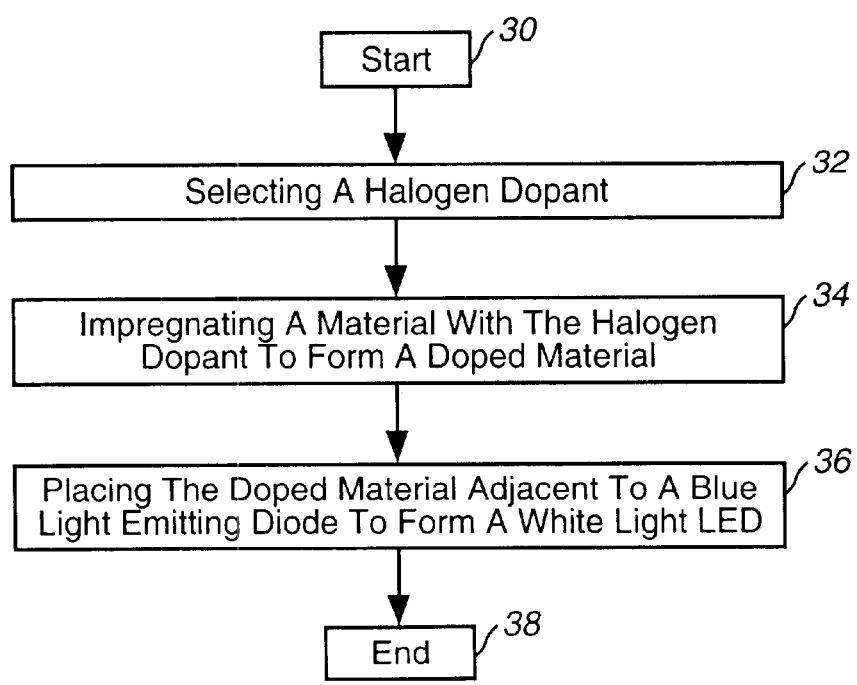
FIG. 2 is a flow chart of the steps used in a method of forming a white light LED in accordance with one embodiment of the invention.

FIG. 2 is a flow chart of the steps used in a method of forming a white light LED in accordance with one embodiment of the invention. The process starts, step 30, by selecting a halogen dopant at step 32. In one embodiment, the halogen dopant is molecular iodine. At step 34 a material is impregnated with the halogen dopant to form a doped material. The material may be a polymer (e.g., PMMA—polyamide—poly Methyl Methacylate or Elvamide®—polyamide), Solgels, glasses formed by sintering solgels, organically modified solgels (ormosil), and hybrids materials. Note that impregnated polymer materials into a porous solgel are sometimes referred to as polycom glass. At step 36, the doped material is then placed adjacent to a blue light LED to form a white light LED which ends the process at step 38. In one embodiment, the doped material is used as a coating on the casing of the blue light LED. The coating may have a thickness of 100 μm to 500 μm and a doping factor of $10^{17}$–$10^{19}$ parts per cubic centimeter.

Figure 3:
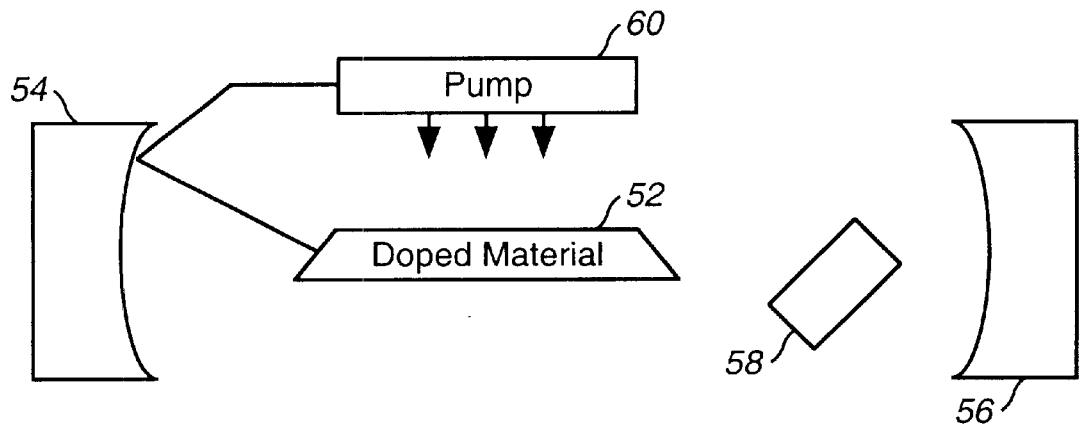
FIG. 3 is a schematic diagram of a tunable solid state laser in accordance with one embodiment of the invention.

FIG. 3 is a schematic diagram of a tunable solid state laser 50 in accordance with one embodiment of the invention. The laser 50 has a high quality solid material 52 impregnated with a halogen. In one embodiment, the halogen dopant is molecular iodine. The doped material 52 is contained in an optical resonator formed by two mirrors 54, 56 and may contain an etalon 58. The etalon 58 may be used to tune the laser 50. An optical excitation source 60 is used to pump the doped material 52. In one embodiment, the solid material may be a polymer (e.g., PMMA or Elvamide®), Solgels, glasses formed by sintering solgels, organically modified solgels (ormosil), and hybrids materials. Solgels or other glass material are generally preferred due to their superior thermal performance (high thermal conductivity and low dn/dT). The lasing material 52 may be doped with other elements to provide even better thermal performance.

In one embodiment the optical excitation source is an argon ion laser. Other potential pump sources include flash lamps, arc lamps, xenon and mercury lamps, and blue or violet diode lasers (e.g., GaN, BN, AlN). Any optical source that has an output wavelength in the 400 nm to 500 nm may be used as a pump source.

The laser may be tuned over a wide range due to the broad emissive spectrum of the diatomic halogens molecules doped in a solid material. The tuning system may be any conventional laser tuning method.

Figure 4:
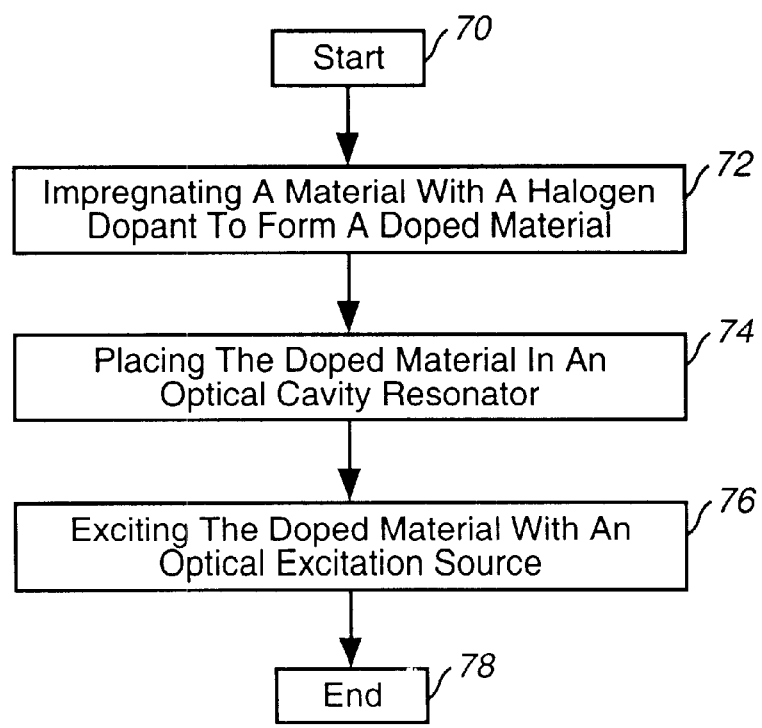
FIG. 4 is a flow chart of the steps used in a method of forming a tunable solid state laser in accordance with one embodiment of the invention.

FIG. 4 is a flow chart of the steps used in a method of forming a tunable solid state laser in accordance with one embodiment of the invention. The process starts, step 70, by impregnating a material with a halogen dopant to form a doped material at step 72. The doped material is placed in an optical cavity resonator at step 74. At step 76, the doped material is excited by an optical excitation source which ends the process at step 78. In one embodiment molecular iodine is impregnated into a solgel. In another embodiment, the optical cavity resonator is adjusted to obtain the desired wavelength (output wavelength). Three examples of how the halogen dopant may be impregnated into a material are provided below:

Iodine Doped Elvamide®Film (Elvamide® is a Dupont Nylon Polymer)

Hereafter Elvamide is generically called polyamide.

1. Place a slide or suitable substrate on the hotplate with three to four pieces of the polyamide on top of it. Heat up the pieces until they have melted (m.p. 155° C.), but take care not to heat them much higher than the melting point.
2. Add 5 mg of fine iodine ($I_2$) powder onto the polyamide. The polyamide will appear purple. Continuously stir in iodine until solution appears uniform in color.
3. Spread the polyamide mixture evenly over the slide at a thickness about 3–4 times the desired film thickness. Then gently place another slide on top and let the film slowly cool.
4. When the film has cooled, remove it from the hotplate and place 0.005" template spacers in between the slides. Apply pressure to the slide with clamps and ensure it will end up at the correct thickness. Tighten the clamps outside of the slides on each of the two spacers.
5. Place the slides back on the hotplate and heat to the point set in step 1 (just above the melting point). The air bubbles in the film should now grow large, possibly taking up almost the entire area of the film.
6. At this point turn off the hotplate and let the film slowly cool. As the film cools the air bubbles should grow very small or even disappear. This process may need to be repeated several times to achieve a good quality film.
7. In order to make a film with no iodine, repeat the same process without iodine.

Iodine Doped Solgel Procedure

Method follows classical procedures in literature (L. L. Hench, in Science of Ceramic Chemical Processes, L. L. Hench and D. R. Ulrich, eds. (Wiley, N.Y. 1986).

1. Mix together 15 ml of TEOS (tetraethoxysilane, [Si$(OC_2H_5)_4$]), 12.5 ml of ethyl alcohol, and 12.5 ml of formamide ($CHONH_2$), which is used as a drying agent and contains 2 ml of nitric acid, $HNO_3$.
2. Stir continuously and add 18.3 ml of water, stir for 10 minutes.
3. Add 10 mg of iodine, $I_2$, to solution and continue stirring for 5 minutes.
4. Pour mixture into hermetically sealed mold and let stand for one hour for gelling to occur.
5. Age the gel for 4 days at 60° C.

Alternative procedures to iodine doped solgel.

Alternative Iodine Doped Solgel Procedure A.

1. As in steps 1–3, prepare solgel mixture. Omit the addition of $I_2$ to mixture and proceed to age the gel for 4 days at 60° C.
2. After aging process, remove sample and place in a hermetically sealed glass mold.
3. Add 10 mg of $I_2$ to sample, heat to 60° C. for four hours. Cool sample to room temperature, sample preparation is complete at this point.

Figure 5:
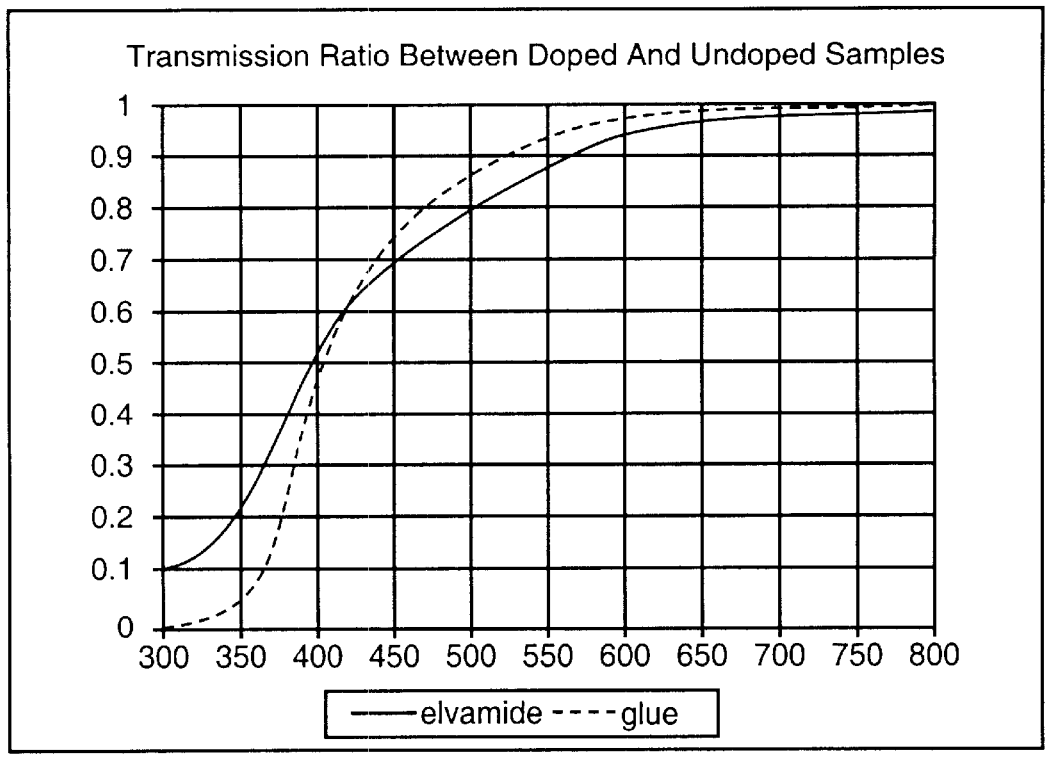
FIG. 5 is a graph of the transmission ratio of two solid state materials doped with molecular iodine in accordance with one embodiment of the invention.

FIG. 5 is a graph of the transmission ratio of two solid state materials doped with molecular iodine in accordance with one embodiment of the invention. One of the solid state materials is a glue and the other is Elvamide®, a polymer. From the graph it is apparent that the iodine doped material have a high absorption in the blue and UV part of the optical spectrum. The process of doping the polymer with molecular iodine includes heating the plastic or dissolving it a solvent. The molecular iodine is then mixed through out the plastic. The plastic is then cured.

Figure 6:
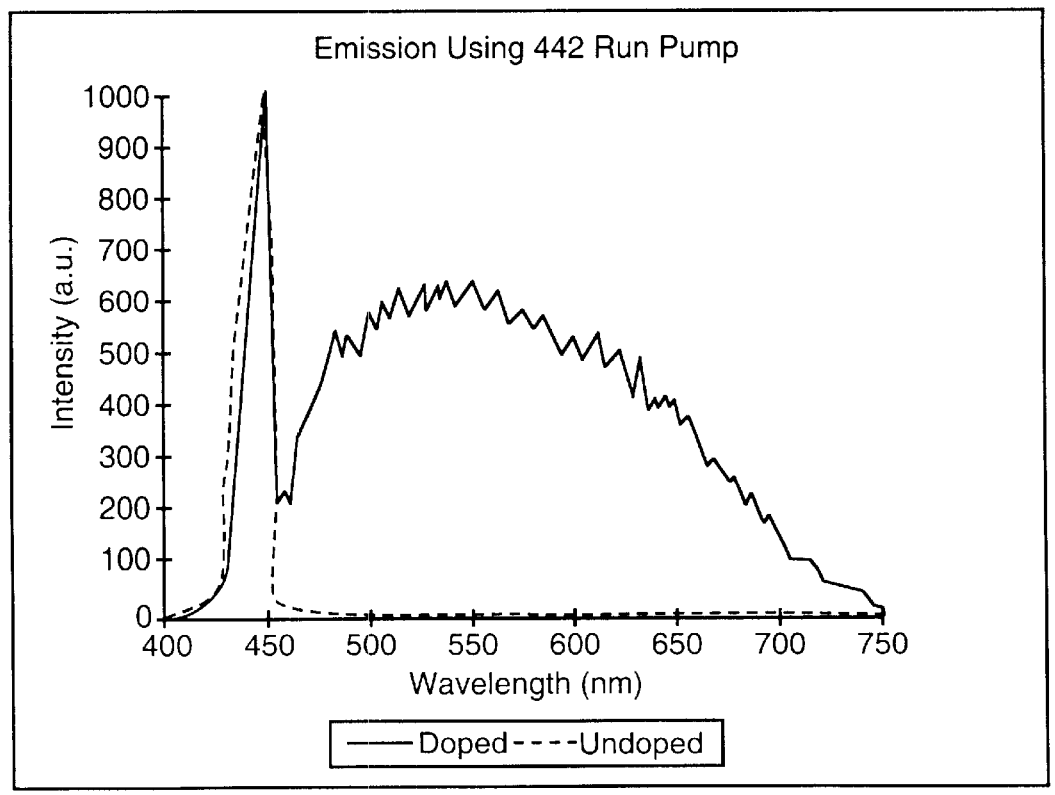
FIG. 6 is a graph of the emission spectra from a doped and an undoped materal in accordance with one embodiment of the invention.

FIG. 6 is a graph of the emission spectra from a doped and an undoped material in accordance with one embodiment of the invention. This graph shows broad emissive spectrum of molecular iodine when embedded in a solid material. This allows a solid state laser doped with molecular iodine to have a broad tuning range.

Thus there has been described an inexpensive method of making a white light LED that has a long life. In addition, there has been described a tunable solid state laser that has a long life.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A process of altering a wavelength of a light emitting diode, comprising the steps of:

a) selecting a halogen dopant;

b) impregnating a material with the halogen dopant to form a doped material; and c) placing the doped material adjacent to a blue light emitting diode to form a white light LED.

2. The process of claim 1, wherein step (a) further includes the step of selecting molecular iodine.

3. The process of claim 1, wherein step (b) further includes impregnating the halogen dopant in a polymer.

4. The process of claim 1, wherein step (b) further includes impregnating the halogen dopant in a solgel.

5. The process of claim 1, wherein step (c) further includes the step of coating a casing of the blue light emitting diode with the doped material.

6. The process of claim 5, wherein the step of coating the casing includes placing a layer having a thickness of 100 $\mu$m to 500 $\mu$m.

\* \* \* \* \*